United States Patent [19]
Hines et al.

[11] Patent Number: 6,067,999
[45] Date of Patent: May 30, 2000

[54] METHOD FOR DEPOSITION TOOL CLEANING

[75] Inventors: Cynthia Marie Hines; James Nicholas Pinto, both of Essex Junction, Vt.

[73] Assignee: International Business Machines Corporation, Armonk, N.Y.

[21] Appl. No.: 09/065,798

[22] Filed: Apr. 23, 1998

[51] Int. Cl.$^7$ ..................................... G08B 6/00
[52] U.S. Cl. ................................. 134/1.1; 134/1; 134/1.2; 134/2; 134/3; 134/19; 134/21; 134/22.1; 134/22.14; 134/22.19; 134/36; 134/41; 134/42; 156/345; 156/643; 216/67; 216/68; 438/710
[58] Field of Search ................................ 134/1.1, 1, 22.1, 134/1.2, 2, 3, 19, 21, 36, 41, 42, 22.14, 22.19; 156/345, 643, 22.19; 216/67, 68; 438/710

[56] References Cited

U.S. PATENT DOCUMENTS

| | | | |
|---|---|---|---|
| 4,310,380 | 1/1982 | Flamm et al. | 156/643 |
| 4,617,087 | 10/1986 | Iyer et al. | 156/643 |
| 4,654,112 | 3/1987 | Douglas et al. | 156/643 |

(List continued on next page.)

OTHER PUBLICATIONS

Bruno et al. "Study of $NF_3$ plasma cleaning of reactors of amorphous silicon deposition", Journal of Vacuum Science Technology, A 12(3), May/Jun. 1994, pp. 690–698.

Burggraaf, P. "LPCVD Tube Cleaning: A Dirty Job Gets Easier", Semiconductor International, Apr. 1995, pp. 69–73.

D'Couto et al. "Residual Gas Analysis Suggests Process Improvement", Semiconductor International, Jul. 1996, pp. 343–350.

Donnelly et al. "Anisotropic etching of $SiO_2$ in low–frequency $CF_4/O_4$ and $NF_3/Ar$ plasmas", Journal of Applied Physics vol. 55 No. 1, Jan. 1984, pp. 242–252.

Huling et al. "A simple in situ cleaning method for LPCVD polysilicon and silicon nitride tubes", Solid State Technology, Oct. 1994, pp. 73–76.

Ino et al. "Plasma Enhanced In Situ Chamber Cleaning Evaluated by Extracted–Plasma–Parameter Analysis", IEEE Transactions on Semiconductor Manufacturing vol. 9 No. 2, May 1996, pp. 230–240.

Pope et al. "Manufacturing Integration of Real–Time Laser Interferometry to Isotropically Etch Silicon Oxide Films for Contacts and Vias", SPIE vol. 2091, pp. 185–196.

Streif et al. "PFC Reduction Through Process And Hardware Optimization", Semiconductor International, Jun.1997, pp. 129–134.

Sey–Ping Sun et al "Reducing PFC Emissions Using $C3F8$–Based PECVD Clean" Semiconductor International, Feb. 1998 pp. 85–92.

*Primary Examiner*—Randy Gulakowski
*Assistant Examiner*—S. Carrillo
*Attorney, Agent, or Firm*—Schmeiser, Olsen & Watts; Howard J. Walter

[57] ABSTRACT

A method of cleaning a deposition tool to control and minimize emission of environmentally deleterious materials includes the steps of: a) establishing a predetermined temperature in a processing chamber; b) providing a mixture of between 15 and 25 percent nitrogen trifluoride in helium at a mixture flow rate of more than 550 standard cubic centimeters per minute (sccm); c) establishing a high pressure of 1.5 to 9.5 torr in the processing chamber; d) establishing a plasma in the processing chamber, e) establishing a low pressure in the processing chamber of 2 torr or less; and f) establishing a plasma in the processing chamber. Instead of a two-step cleaning method, the method may alternatively be executed as a one-step cleaning method. Either method may be optimized by, among other things, providing 19% nitrogen trifluoride. The two-step method may also be optimized by providing a high pressure of about 7 to 9.5 torr and a low pressure of about 1.5 torr.

24 Claims, 7 Drawing Sheets

U.S. PATENT DOCUMENTS

| | | | |
|---|---|---|---|
| 4,749,440 | 6/1988 | Blackwood et al. | 156/646 |
| 4,774,151 | 9/1988 | Cuomo et al. | 428/698 |
| 4,807,016 | 2/1989 | Douglas | 357/67 |
| 4,851,295 | 7/1989 | Brors | 428/450 |
| 4,904,341 | 2/1990 | Blaugher et al. | 156/643 |
| 5,015,331 | 5/1991 | Powell | 156/643 |
| 5,041,311 | 8/1991 | Tsukune et al. | 427/255.3 |
| 5,164,330 | 11/1992 | Davis et al. | 156/643 |
| 5,183,647 | 2/1993 | Harada et al. | 423/239 |
| 5,207,836 | 5/1993 | Chang | 134/1 |
| 5,209,803 | 5/1993 | Powell | 156/345 |
| 5,259,923 | 11/1993 | Hori et al. | 156/643 |
| 5,281,302 | 1/1994 | Gabric et al. | 156/345 |
| 5,326,723 | 7/1994 | Petro et al. | 437/192 |
| 5,356,478 | 10/1994 | Chen et al. | 134/1 |
| 5,413,670 | 5/1995 | Langan et al. | 134/1.2 |
| 5,417,948 | 5/1995 | Iwata et al. | 423/239.1 |
| 5,421,902 | 6/1995 | Odajima et al. | 134/19 |
| 5,421,957 | 6/1995 | Carlson et al. | 216/58 |
| 5,423,940 | 6/1995 | Chen et al. | 216/66 |
| 5,454,903 | 10/1995 | Redeker et al. | 216/67 |
| 5,514,246 | 5/1996 | Blalock | 156/643.1 |
| 5,647,953 | 7/1997 | Williams et al. | 156/643.1 |
| 5,700,741 | 12/1997 | Liao | 438/723 |
| 5,756,400 | 5/1998 | Ye et al. | 438/710 |
| 5,788,778 | 8/1998 | Shang et al. | 134/1 |
| 5,788,799 | 8/1998 | Steger et al. | 156/345 |
| 5,817,534 | 11/1998 | Ye et al. | 438/10 |
| 5,843,239 | 12/1998 | Shrotriya | 134/1.1 |
| 5,849,092 | 12/1998 | Xi et al. | 134/1.1 |

METHOD FOR DEPOSITION TOOL CLEANING

BACKGROUND OF THE INVENTION

1. Technical Field

This invention relates to the field of deposition tool cleaning. More specifically, the invention relates to a method for cleaning plasma enhanced chemical vapor deposition (PECVD) tools.

2. Background Art

In the electronics industry, various techniques have been developed whereby selected materials, such as, conductors, insulators, or semiconductors, may be deposited on a substrate. For example, such techniques are often used to deposit successive conductive, semi-conductive, or insulative layers on a silicon wafer in the production of an integrated circuit (IC). Generally, deposition techniques result in a film of deposition materials collecting on surfaces other than the target substrate, that is, the deposition materials also collect on the tool surfaces or other equipment used in the deposition process. In many electronic component fabrication processes, a very clean environment is required to produce components of acceptable quality. The film that builds up on the tool or other equipment surfaces may easily degrade cleanliness and lead to defects in the component. Accordingly, it is well accepted that deposition tools or other equipment must be periodically cleaned to remove the unwanted film of deposition materials.

One type of deposition process is chemical vapor deposition (CVD), wherein reactants are introduced as gases into a heated processing chamber. The heat assists reaction of the gaseous components and the resulting reaction product deposits on the desired substrate. As discussed above, the reaction product (deposition material) also deposits on the walls of the chamber and other equipment therein, creating a potentially deleterious film. One subtype of CVD is plasma enhanced CVD (PECVD), wherein a plasma is established in the processing chamber. Exposing the reactants to the plasma increases their reactivity, thus, less heat is required in the chamber to yield the desired deposition.

A generally preferred method of cleaning deposition tools, particularly PECVD tools, involves the use of fluorinated compounds. For example, $C_2F_6$, a perfluorinated compound (PFC), is very frequently used. Other PFCs, such as $CF_4$, $C_3F_8$, $SF_6$, and $NF_3$ are also used. Essentially, the combination of a plasma and a PFC generates chemically active fluorine species, such as ions and radicals, that react with the film on the chamber walls and other equipment, producing a gaseous product that can then be removed from the tool. Unfortunately, PFCs are have been found to contribute to global warming and $C_2F_6$ has a long atmospheric life of more than 10,000 years. Depending on the process, as much as 80% of $C_2F_6$ used in a clean can be unreacted and exhausted into the atmosphere. High emissions of other PFCs have been similarly observed. Accordingly, extensive efforts are underway in the semiconductor industry to reduce PFC emissions through replacement with non-PFCs, abatement of excess emissions, etc. For example, destruction or recycling of the unreacted PFCs has been and continues to be explored. Destruction and recycling have been somewhat successful in reducing PFCs without impact on the cleaning process, nevertheless, such options require significant and costly modifications to existing tools or other equipment.

One problem with such efforts is that they concentrate on reducing emissions without any significant change in the various cleaning methods currently used. By contrast, what is needed is a fundamental change in current cleaning methods specifically for the purpose of reducing emissions. Fundamental changes in cleaning methods have been proposed in the past, however, the purpose of such changes has been to improve cleaning ability, not to reduce PFC emissions. For example, PFCs have been combined with other gases in attempts to improve cleaning ability. $NF_3/O_2$ cleans were once used to clean CVD tools, but they yielded overly reactive conditions, producing excessive wear on the tools, inconsistent cleaning of the tools, and problems with foreign material in components fabricated using the cleaned tools. Also, $NF_3/Ar$ cleans have been attempted with similar problems due partly to sputtering of the argon. Since previous fundamental changes concentrated on improving cleaning ability, it is no surprise that they have not produced the needed reduction in emissions.

Thus, it can be seen from the above discussion that it would be an improvement in the art to provide a fundamentally changed method for cleaning deposition tools, particularly CVD tools, that reduces PFC emissions. To be clearly suitable as a replacement for existing cleaning methods, such method should offer comparable cleaning ability without impacting fabrication of components and incurring excessive costs.

DISCLOSURE OF INVENTION

According to the present invention, a method of cleaning a deposition tool is provided to control and minimize emission of environmentally deleterious materials. The method includes the steps of: a) establishing a predetermined temperature in a processing chamber of a deposition tool; b) providing a mixture of between 15 and 25 percent nitrogen trifluoride in inert gas at a mixture flow rate of more than 200 standard cubic centimeters per minute (sccm); c) establishing a high pressure in the processing chamber; and d) establishing a plasma in the processing chamber to chemically activate at least a portion of the nitrogen trifluoride, producing a utilization efficiency of more than 60%. The method may be optimized to produce greater than 80% utilization efficiency, for example by, among other things, providing 19% nitrogen trifluoride, using helium as the inert gas, or providing a mixture flow rate of greater than 550 sccm.

Also, another method of cleaning a deposition tool is provided to control and minimize emission of environmentally deleterious materials, wherein the other method includes a second cleaning step performed at a low pressure of 2 torr or less. The two-step method may also be optimized as described above, but further optimized by providing a high pressure of about 7 to 9.5 torr and a low pressure of about 1.5 torr.

In addition, a method of operating a deposition tool is provided to control and minimize emission of environmentally deleterious materials, wherein the method includes effectuating the deposition of at least one predetermined material on the surface of a semiconductor substrate as well as cleaning the deposition tool.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements, and.

BEST MODE FOR CARRYING OUT THE INVENTION

According to a preferred embodiment of the present invention, a method of cleaning a deposition tool is provided to control and minimize emission of environmentally deleterious materials. The method includes the steps of: a) establishing a predetermined temperature in a processing chamber of a deposition tool; b) providing a mixture of between 15 and 25 percent nitrogen trifluoride in inert gas at a mixture flow rate of more than 200 standard cubic centimeters per minute (sccm); c) establishing a high pressure in the processing chamber; d) establishing a plasma in the processing chamber to chemically activate at least a portion of the nitrogen trifluoride and to cause localized removal of accumulated deposition material, producing a utilization efficiency of more than 60%; e) establishing a low pressure in the processing chamber; and f) establishing a plasma in the processing chamber to chemically activate at least a portion of the nitrogen trifluoride and to cause generalized removal of accumulated deposition material, producing a utilization efficiency of more than 60%. Instead of a two-step cleaning method, the method may alternatively be executed as a one-step cleaning method without steps e) and f). Either method may be optimized to produce greater than 80% utilization efficiency, preferably by, among other things, providing 19% nitrogen trifluoride, using helium as the inert gas, or providing a mixture flow rate of greater than 550 sccm. The two-step method may also be optimized by providing a high pressure of about 7 to 9.5 torr and a low pressure of about 1.5 torr.

Figure 2:
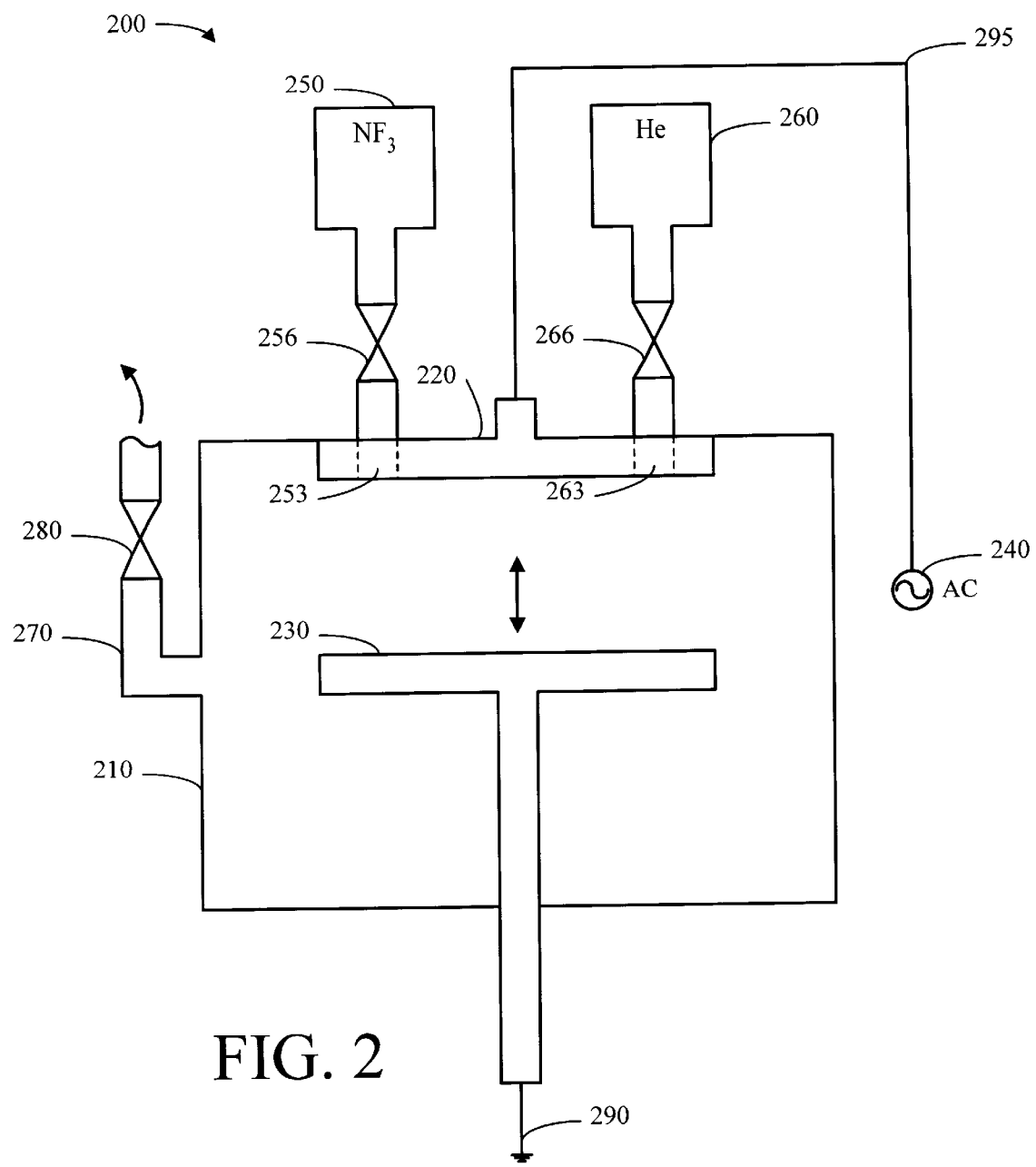
FIG. 2 is a side view of a PECVD deposition chamber suitable for use in a cleaning method according to the present invention.

Referring to FIG. 2, a deposition tool 200 suitable for plasma enhanced chemical vapor deposition (PECVD) is shown including, inter alia, a processing chamber 210, a face plate 220, a susceptor 230, a power source 240, a power input 295, and an electrode ground 290. According to a preferred embodiment of the present invention, a $NF_3$ gas supply 250 and a He gas supply 260 are also provided when deposition tool 200 is to be cleaned. The flow rate of $NF_3$ gas into processing chamber 210 through a face plate orifice 253 is controlled using a valve 256. Similarly, the flow rate of He gas into processing chamber 210 through a face plate orifice 263 is controlled using a valve 266. Removal of gases from processing chamber 210 through vent line 270 is controlled using throttling valve 280.

As is well known to persons of ordinary skill in the art, PECVD occurs in deposition tool 200 by first providing a substrate, such as a conductor, insulator, or semiconductor substrate, on susceptor 230. Susceptor 230 is often heated so that the substrate can be easily maintained at a particular temperature conducive to deposition. Reactants are then introduced as gases into processing chamber 210 while providing a plasma. By controlling the conditions in processing chamber 210 at a predetermined temperature, pressure, gas flow rates, radio frequency (RF) power, etc., the gaseous components react and the resulting reaction product deposits on the desired substrate. The reaction product (deposition material) also deposits on the walls of the chamber and other equipment therein, creating a potentially deleterious film that must be periodically removed. Although not shown, deposition tools other than tool 200 may be cleaned using the method discussed below according to the present invention, provided a plasma and other required process conditions may be established in a chamber where cleaning is to occur. That is, the cleaning method is not limited to removing deposition materials that were deposited by PECVD.

Figure 3:
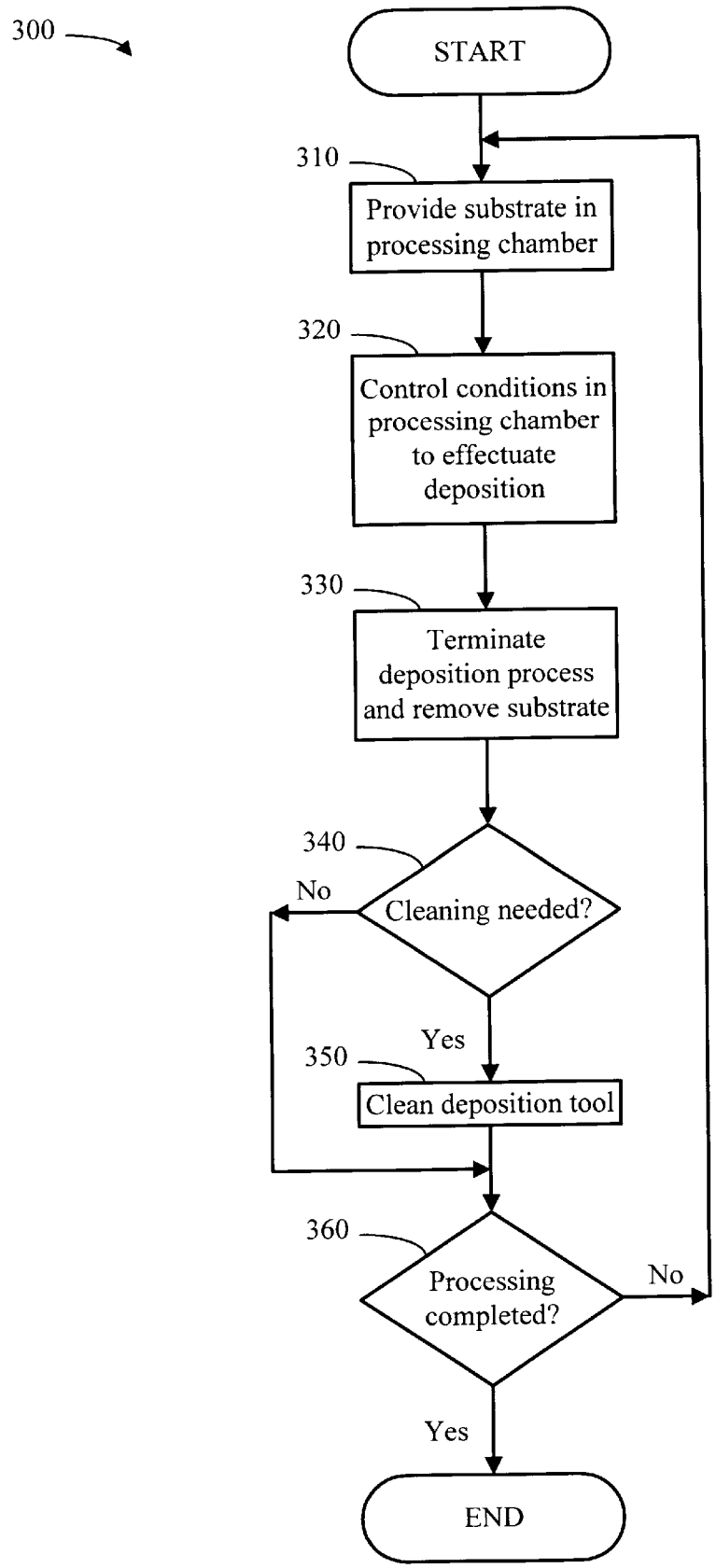
FIG. 3 is a flow diagram showing a method of depositing a deposition material on a substrate as well as cleaning the deposition tool.

As shown in FIG. 3, a generic deposition method 300 may begin with a step 310 of providing a substrate in a processing chamber, such as processing chamber 210. Next, step 320 includes controlling any applicable deposition conditions, such as temperature, pressure, gas flow rates, RF power, etc., in processing chamber 210 to effectuate deposition. Such conditions are known by those skilled in the art and, typically, pressure is below atmospheric pressure. As indicated, the deposition mechanism may involve PECVD or some other mechanism, such as various types of CVD, physical vapor deposition (PVD), etc. In step 330, the deposition process is terminated and the substrate removed from processing chamber 210. If cleaning is needed as indicated in step 340, then method 300 proceeds to a step 350 of cleaning the deposition tool. Otherwise, when no cleaning is needed, method 300 proceeds to step 360. According to step 360, unless processing is completed, processing continues with step 310 of providing another substrate in processing chamber 210 and repeating the subsequent steps.

Figure 4:
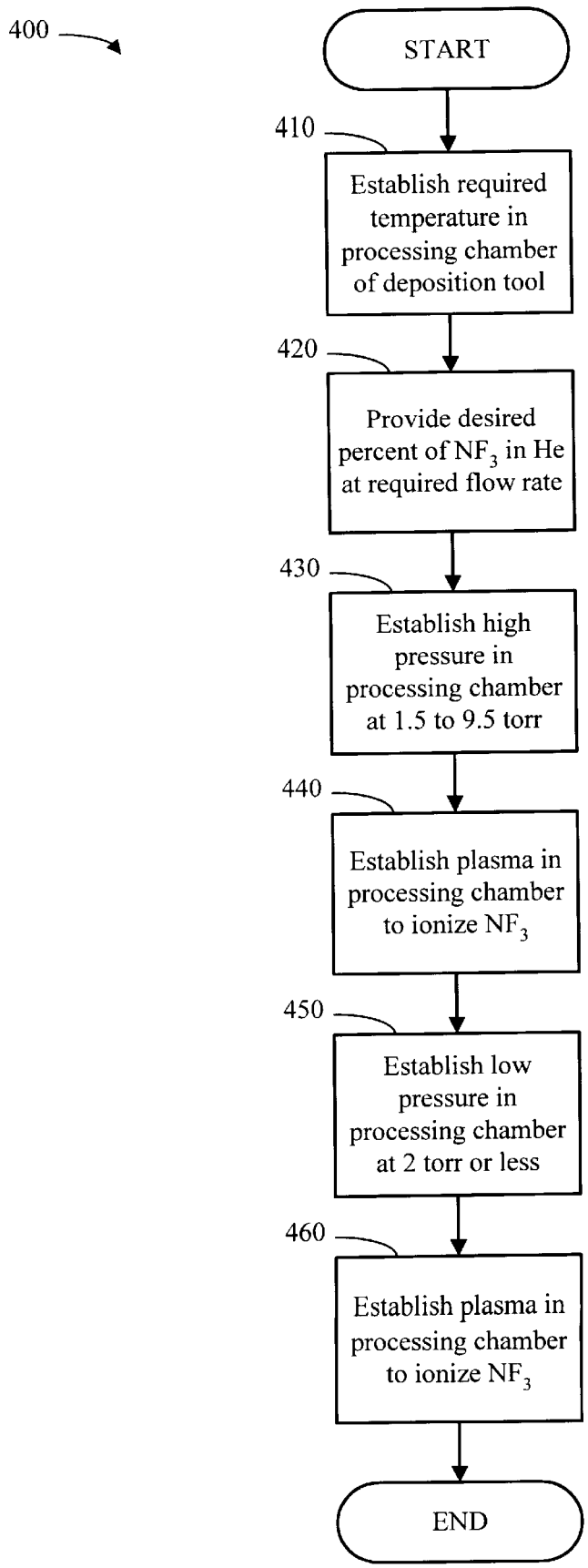
FIG. 4 is a flow diagram showing a two-step cleaning method according to a preferred embodiment of the present invention.

Referring to FIG. 4, a two-step cleaning method 400 for removing deposition material from a tool while reducing PFC emissions is shown according to a preferred embodiment of the present invention. Notably, cleaning method 400 may be integrated into deposition method 300 as step 350 of cleaning the deposition tool, as is preferred, or cleaning method 400 may be conducted independently. Cleaning method 400 begins with a step 410 of establishing the required temperature in processing chamber 210 of deposition tool 200. The appropriate temperature will depend on the particular type of deposition tool 200, deposition process 300, deposition material, plasma characteristics desired, etc. If cleaning method 400 is integrated into deposition method 300 as step 350, then step 410 preferably involves maintaining approximately the same temperature already selected in step 320. Often, step 410 is accomplished by maintaining the temperature of susceptor 230 at the temperature required in step 320 above. Maintaining the same temperature prevents equipment wear from temperature cycling and avoids the delay required after cleaning to reestablish the temperature needed for a repeat of step 320. Exemplary temperatures are discussed in the examples below but are preferably greater than 200° C.

Alternatively, when cleaning method 400 is conducted independently, an appropriate temperature should be established in processing chamber 210 to accomplish removal of deposition material. Generally, the temperature of step 410 will be approximately the same as the temperature at which the deposition originally occurred. However, it may be possible to achieve improved removal efficiency by establishing a higher temperature than used for deposition, such that ions, radicals, and other chemically active species with greater reactivity are provided to combine with the deposition material. When cleaning method 400 is being conducted independent of deposition method 300, there is probably no concern regarding processing delays to reestablish some particular temperature after completion of two-step cleaning method 400.

Next, a step 420 includes providing a mixture of between 15 and 25 percent $NF_3$ in He at a mixture flow rate of greater than 200 sccm. Preferably, approximately 19% $NF_3$ is provided. As shown in FIG. 2, the $NF_3$ and He may be delivered through individual face plate orifices 253 and 263, wherein mixture occurs in processing chamber 210. In such case, the flow rate of $NF_3$ through orifice 253 plus the flow rate of He through orifice 263 combine to give a mixture flow rate of greater than 200 sccm. Alternatively, the two gases may be premixed before entering processing chamber 210, wherein the mixture flow rate is also greater than 200 sccm. Preferably, the mixture flow rate is greater than 550 sccm, but most preferably it is approximately 725 sccm. Also, although He is preferably used, other inert gases known in the art may also be used, for example, argon, nitrogen, nitrous oxide, mixtures thereof, etc. The principles of the present invention still hold true if other than He is used for the inert gas, however, some modification to the ranges of process parameters described herein may be required to achieve similar results using an alternative inert gas.

Next, in a step 430, a high pressure is established in processing chamber 210 of deposition tool 200. Pressure adjustment occurs by controlling throttling valve 280 of vent line 270 such that a selected pressure is achieved while the $NF_3$/He fills processing chamber 210. The numeric value of a high pressure condition is somewhat relative to the optimum pressure of a particular deposition tool 200 being cleaned. For example, in an AME P5000 (a single chamber PECVD tool available from Applied Materials, Inc. in Santa Clara, Calif.), approximately 9.5 torr is the optimum pressure of the tool, but the optimum pressure of other tools may be less, at about 3 torr. In an AME P5000, a pressure of preferably 1.5 to 9.5 torr would be considered a high pressure, but it is most preferably between 7 to 9.5 torr. If the optimum pressure of the tool were higher, then it may be preferable, in keeping with the principles discussed below, to establish a pressure even higher than 9.5 torr. That is, adjustment of other process conditions may be required if a pressure higher than 9.5 torr is used.

The objective of establishing a high pressure is to provide a sufficient amount of gas molecules to cause localized removal of accumulated deposition material when a plasma is established, as in step 440 that occurs next. Step 440 may be termed the first cleaning step or "inner clean" in two-step cleaning method 400. A two-step method is preferred since the accumulation of deposition materials is often higher at the point were reactant gases enter deposition chamber 210, such as at face plate 220. Providing a high pressure in step 430 helps create an intense plasma in step 440 about face plate 220. The intense plasma assists in removing accumulated deposition material more quickly than a subdued plasma that would be generated at a low pressure. If the intense plasma cleans the center of face plate 220, but does not extend the clean out to the edge of face plate 220, then pressure may be too high. A high pressure tends to limit the size of the plasma and lowering pressure may expand its size, likewise increasing the area cleaned by the intense plasma. Preferably, the pressure and other process conditions discussed above are also adjusted to provide a $NF_3$ utilization efficiency of greater than 60%, or most preferably, greater than 80%. That is, preferably greater than 60% of the $NF_3$ is chemically activated and reacts with the accumulated deposition material, but most preferably greater than 80% does so.

Preferably, susceptor 230 is raised to a first position in step 430, where it is relatively close to face plate 220, to localize the intense plasma within the gap between face plate 220 and susceptor 230. The localization occurs because the RF power electric field creating the plasma is generated between face plate 220 and susceptor 230. A smaller gap allows less widening of the electric field outside the edges of face plate 220 and susceptor 230. Accordingly, the smaller gap allows less generalization of the plasma to regions other than directly between face plate 220 and susceptor 230. The actual gap distance between face plate 220 and susceptor 230 will vary depending on the particular deposition tool 200, deposition process 300, deposition material, plasma characteristics, etc. In some tools, the first position of susceptor 230 may simply be the closest possible position to face plate 220.

The length of step 440 (inner clean), will also depend on the particular type of deposition tool 200, deposition process 300, deposition material, plasma characteristics, etc. The objective is to remove enough accumulation such that the amount remaining more closely resembles the amount of accumulation on other regions of deposition chamber 210, rather than to completely clean the more abundant accumulation around face plate 220. It is important not to over clean in step 440, since exposure of face plate 220 and other components to the intense plasma may cause excessive wear to the components.

One factor influencing the nature of the plasma created in step 440 is the RF power applied by power source 240. The RF power available to create the plasma (net power) is equal to the generator power minus various losses during the process of delivering and controlling the RF power to face plate 220. The generator power on an AME P5000 is preferably about 950 watts (W), the maximum power possible on the tool, however, the losses fluctuate during cleaning method 400 so net power also fluctuates. The losses will also vary between manufacturers and types of deposition tools.

After the inner clean of step 440, a step 450 is executed to establish a low pressure in processing chamber 210. The numeric value of a low pressure condition will depend on the same factors discussed above that determine the numeric value of a high pressure condition, except that the objective of the low pressure condition is different. In an AME P5000 a low pressure is preferably about 2 torr or less, but most preferably about 1.5 torr. The objective of establishing a low pressure is to provide a diminished amount of gas molecules to cause generalized removal of accumulated deposition material when a plasma is established, as in step 460 that occurs next. Step 460 may be termed the second cleaning step or "outer clean" in two-step cleaning method 400. After the inner clean, the remaining, less abundant accumulations are removed by providing a low pressure in step 430 that helps create a subdued plasma in step 460 throughout deposition chamber 210. The subdued plasma removes accumulated deposition material less quickly than the intense plasma generated at a high pressure and with less risk of component wear.

Preferably, susceptor 230 is lowered to a second position in step 450, where it is relatively far from face plate 220, to generalize the subdued plasma outside the edges of face plate 220 and susceptor 230. The generalization occurs, because of the larger gap, when the RF power electric field creating the plasma widens to affect regions other than the area directly between face plate 220 and susceptor 230. The actual gap distance between face plate 220 and susceptor 230 will vary depending on the particular deposition tool 200, deposition process 300, deposition material, plasma characteristics, etc. In some tools, the second position of susceptor 230 may simply be the farthest possible position from face plate 220.

The length of step 460 (outer clean), will also depend on the particular type of deposition tool 200, deposition process 300, deposition material, plasma characteristics, etc. The objective is to complete the partial clean that occurred during step 440. It is also important not to over clean in step 460. However, some over cleaning may be appropriate to remove all accumulations since some exposure of bare components to the subdued plasma may occur without excessive wear. The RF power applied during step 460 may be adjusted or left at the same setting as during step 440. Rather than adjust power, however, it is preferably to adjust other process conditions, such as $NF_3$ percentage, gas flow rate, pressure, face plate-to-susceptor gap, duration of inner or outer clean, etc. to achieve the desired effects. Otherwise, adjusting power up and down in the inner clean, outer clean, and subsequent steps may yield processing delays and, perhaps, inaccuracies. After completion of step 460, other processing may occur according to the manufacturer's specifications or as directed by those skilled in the art to prepare deposition tool 200 for shut down or continuation of deposition method 300. For example, protective seasoning of deposition chamber 210 by depositing a thin $SiO_2$ layer may be recommended. Exemplary process conditions for two-step cleaning method 400 are presented in EXAMPLE 1 below.

EXAMPLE 1

A silicon wafer was coated with approximately 1000 Angstroms (Å) of $SiO_2$ using $O_2$ gas with a tetraethylorthosilicate (TEOS) precursor and placed in the deposition chamber of an AME P5000 PECVD deposition tool in preparation for a first run termed "Clean A". A susceptor temperature of 400° C. was established at a susceptor spacing of 200 mils (5.08 millimeters (mm)) (closest setting to face plate) and flows of 138 sccm $NF_3$ and 590 sccm He were provided to produce 19% $NF_3$ in He. While maintaining susceptor temperature, a high pressure of 9.5 torr was established in the deposition tool and 950 W of generator RF power provided for 15 seconds (sec) to generate a localized plasma and perform the inner clean. Susceptor spacing was changed to 999 mils (25.4 mm) (farthest setting from face plate). While maintaining susceptor temperature, a low pressure of 1.5 torr was established in the deposition tool and 950 W applied for 30 sec to generate a generalized plasma and perform the outer clean. The deposition tool was then purged and seasoned for a second run, termed "Clean B". Clean B was completed at the same process conditions indicated above, except that the duration of the inner and outer cleans were 20 sec and 50 sec, respectively. Cleans C, D, E, and F were also completed similarly with inner/outer clean times of: 30 sec/60 sec, 30 sec/95 sec, 30 sec/150 sec, and 30 sec/180 sec, respectively. The total clean times of Cleans A to F are displayed graphically in FIG. 6. The corresponding etch rates obtained in Cleans A to F are displayed in FIG. 7. Cleans A to F each produced a utilization efficiency of between 80 to 90%.

For comparison purposes, cleans were completed using conventional cleaning compositions under the same process conditions, except for total clean time. For the 900C2F6 cleans, flows of 900 sccm $C_2F_6$ and 940 sccm $O_2$ were provided. For the 600C2F6 cleans, flows of 600 sccm $C_2F_6$ and 600 sccm $O_2$ were provided. For the 300C2F6 cleans, flows of 300 sccm $C_2F_6$ and 600 sccm $O_2$ were provided. The total clean times of Cleans A to F for each composition are displayed in FIG. 6 for easy comparison to the 19% $NF_3$ data. The corresponding etch rates obtained in Cleans A to F are displayed in FIG. 7. As is evident from FIGS. 6 and 7, the method according to the present invention produced satisfactory etch performance under the conditions of EXAMPLE 1 in comparison to conventional cleaning compositions.

Figure 5:
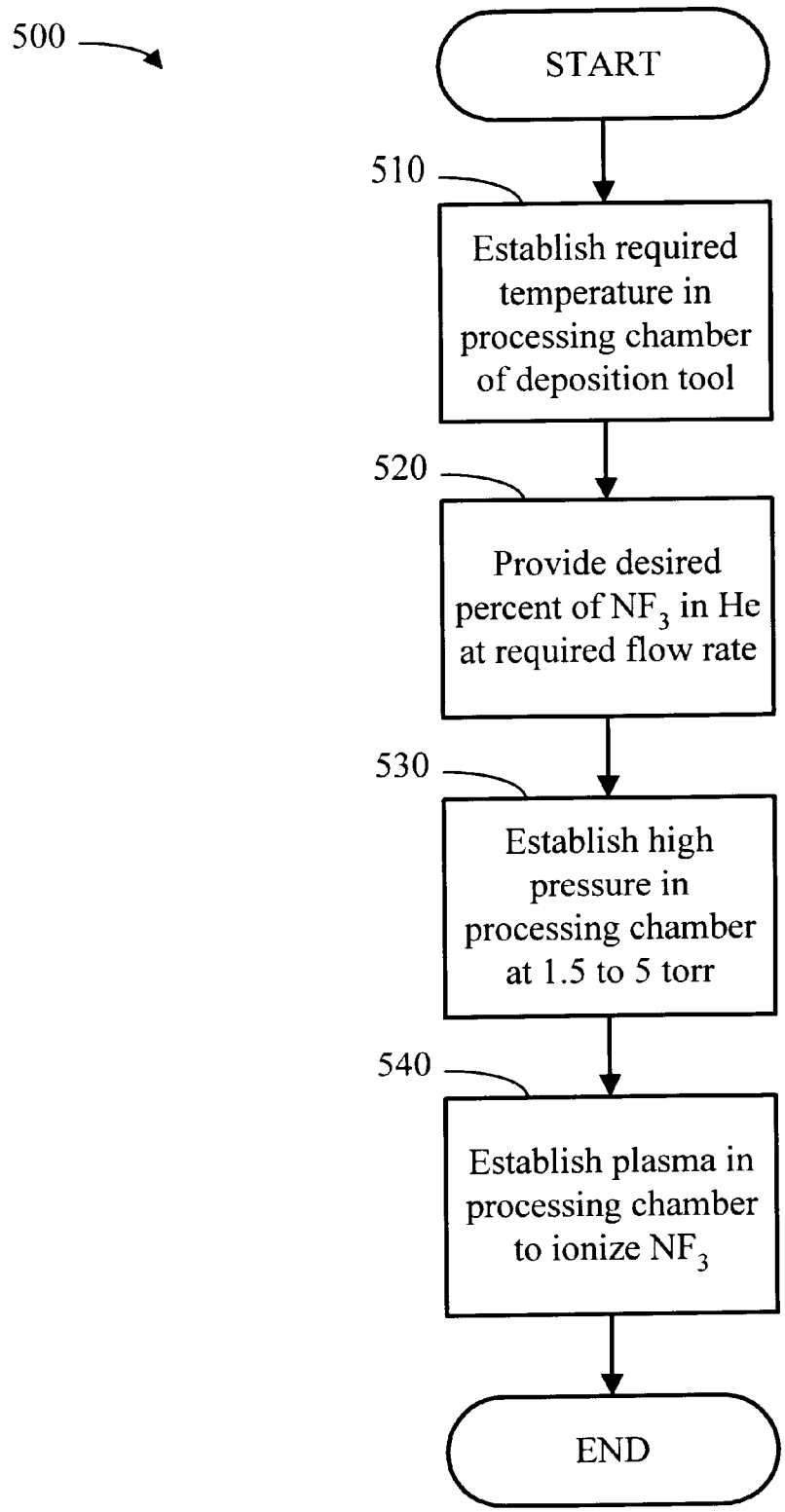
FIG. 5 is a flow diagram showing a one-step cleaning method according to a preferred embodiment of the present invention.

As an alternative to two-step cleaning method 400 described above, the present invention may also be practiced in a one-step cleaning method shown in FIG. 5, although it is not preferred. Essentially, a one-step cleaning method 500 is the same as two-step cleaning method 400, but without low pressure steps 450 and 460. The optimum process conditions for steps 530 and 540 of one-step cleaning method 500 may also be different from steps 430 and 440 of two-step cleaning method 400, but are preferably still within the ranges discussed above. For example, in an AME P5000, where the preferred pressure is 7 to 9.5 torr in two-step cleaning method 400, it may be necessary to operate within a lower preferred pressure range in a one-step cleaning method 500. Since only one cleaning step is performed, the majority of accumulated deposition material will be removed by the intense plasma established at the high pressure. Accordingly, the risk of excessive component wear as a result of exposure to an intense plasma may be reduced by operating at lower pressure. Of course, the risk may be minimized by operating at 1.5 torr, the minimum pressure disclosed for step 530, but such a pressure condition will also extend the needed cleaning time compared to an appropriate clean time at a higher pressure. Thus, the preferred pressure is 1.5 to 5 torr for one-step cleaning method 500 in an AME P5000.

Figure 1:
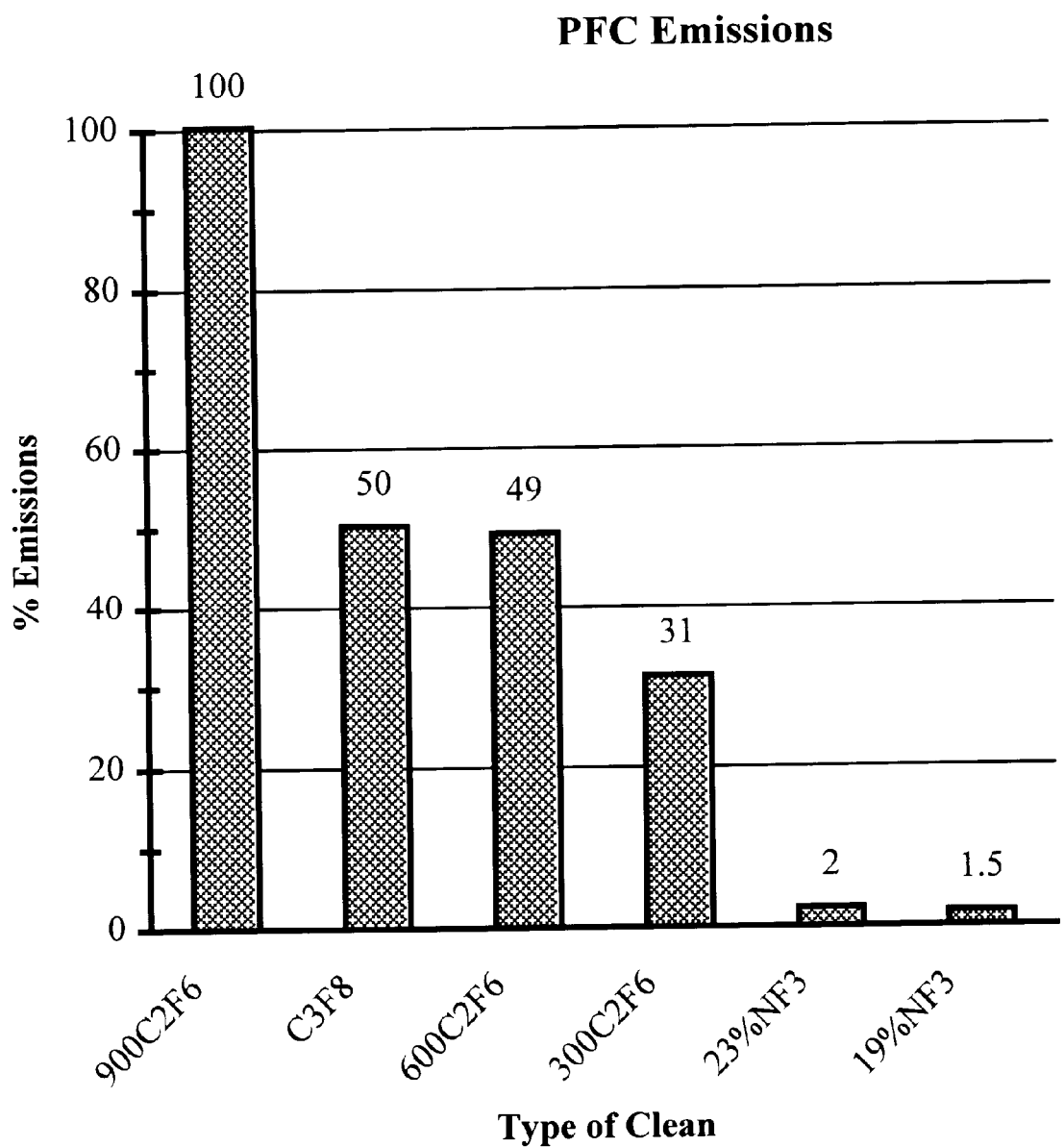
FIG. 1 is a chart comparing PFC emissions resulting from a cleaning method according to the present invention with emissions from other cleaning methods.
Figure 6:
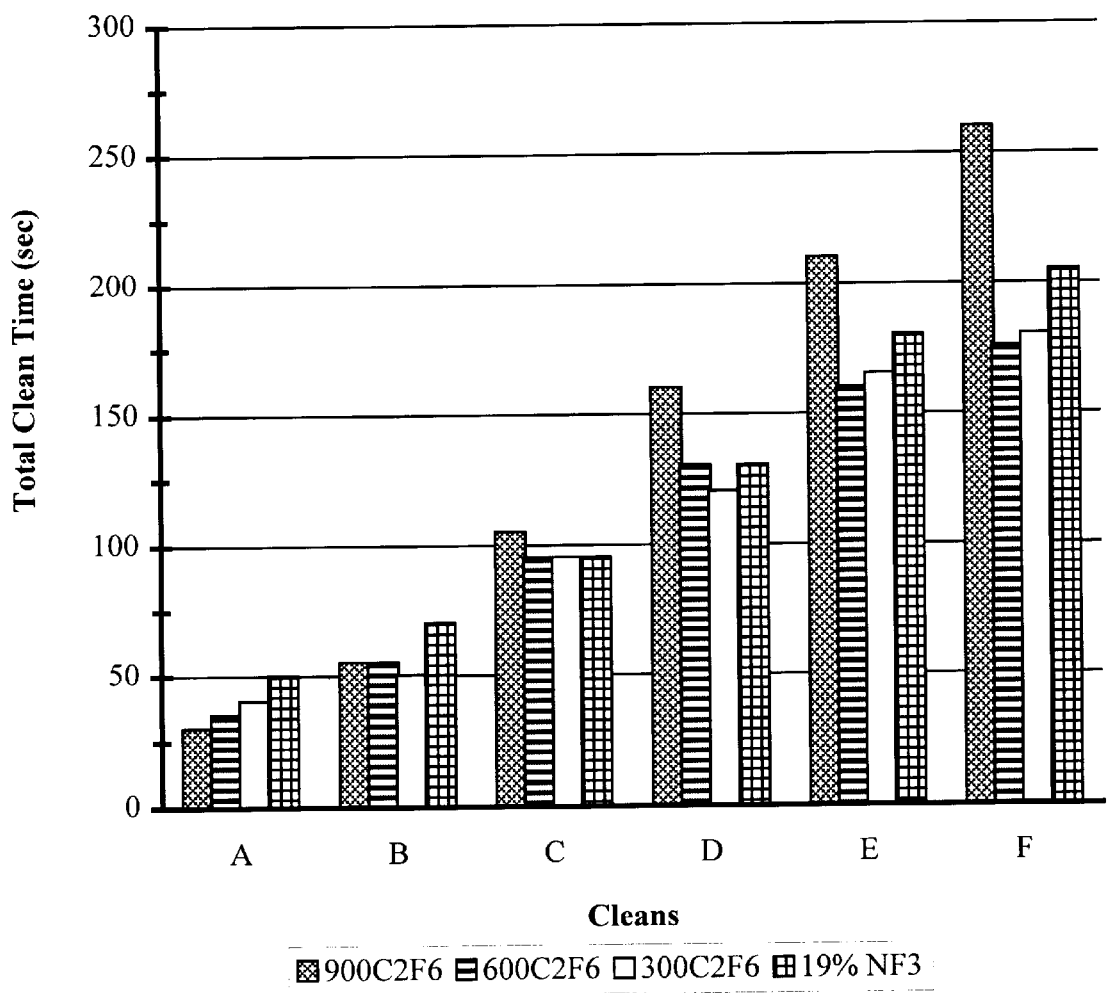
FIG. 6 is a chart comparing total clean time used in EXAMPLE 1.
Figure 7:
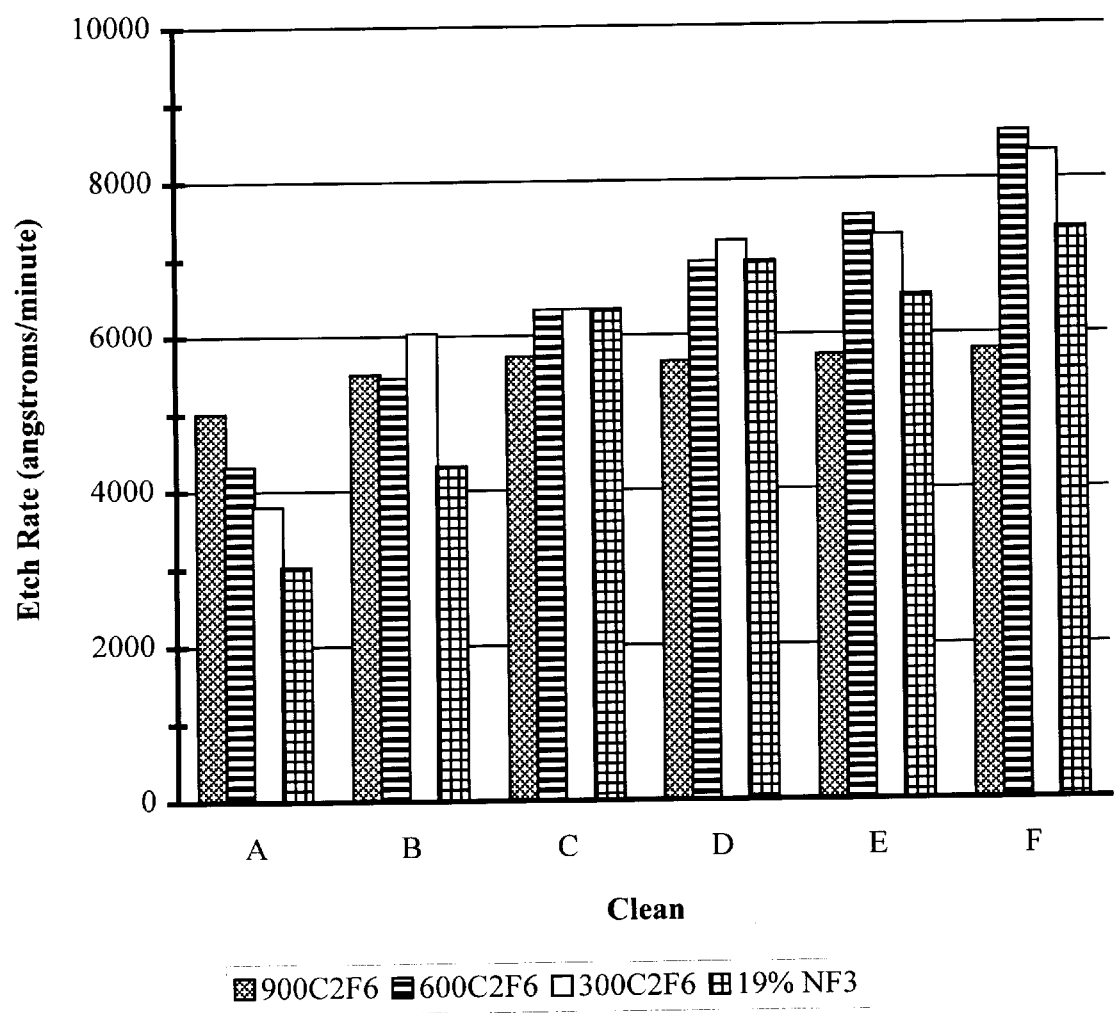
FIG. 7 is a chart comparing etch rates obtained in EXAMPLE 1.

The primary advantage of the cleaning methods discussed above is that they provide a fundamentally changed method for cleaning deposition tools, particularly CVD tools, that reduces PFC emissions. In addition, the methods also offer comparable cleaning ability without impacting fabrication of components and incurring excessive costs. Specifically, the present method provides a PFC gas composition and process conditions that apparently yields chemical activation of substantially all the fluoride atoms in the PFC to ions, radicals, etc. The result of providing the dilute PFC gas mixture at high pressure and high flow rate is adequate cleaning of deposition tool 200 and low PFC emissions. Such advantages are evident from FIGS. 1, 6, and 7. FIGS. 6 and 7 are discussed above. FIG. 1 compares the PFC emissions of a 23% and 19% $NF_3$ clean according to the present invention with the conventional cleans presented in FIGS. 6 and 7 and an analogous $C_3F_8$ cleaning composition and method. Previous efforts to reduce PFC emissions have concentrated on replacement with non-PFCs, abatement of excess emissions, etc. instead of a fundamental change in cleaning methods specifically for the purpose of reducing emissions. Although fundamental changes in cleaning methods have been previously proposed, such changes concentrated on improving cleaning ability, so it is no surprise that they did not produce the needed reduction in emissions.

Nevertheless, the cleaning methods according to the present invention and its preferred embodiments were developed with the specific purpose of reducing PFC emissions. Accordingly, while current references in the art teach away from high pressure, high flow rate, and low PFC concentration, the present invention achieved reduced PFC emissions under such conditions. Surprisingly, the present invention also produced adequate deposition tool cleaning as a result of combining the high pressure, high flow rate, and low PFC concentration conditions. As discussed above, such a cleaning method may be further optimized for lower emissions and improved etch rate by adjusting generator power, face plate-to-susceptor spacing, etc.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as example of a possible sequence and not as a limitation.

What is claimed is:

1. A method of cleaning a chemical vapor deposition chamber, comprising the steps of:
   a) providing a chemical vapor deposition chamber;
   b) establishing a predetermined temperature in the chemical vapor deposition chamber;
   c) providing a mixture comprising between 15 and 25 percent nitrogen trifluoride in an inert gas at a mixture flow rate of more than 550 standard cubic centimeters per minute (sccm);
   d) establishing a pressure greater than 1.5 torr in the chemical vapor deposition chamber;
   e) establishing a plasma in the chemical vapor deposition chamber to chemically activate at least a portion of the nitrogen trifluoride; and
   f) cleaning the chemical vapor deposition chamber using the chemically activated nitrogen trifluoride.

2. The method of claim 1, wherein the mixture comprising between 15 and 25 percent nitrogen trifluoride in the inert gas comprises about 19 percent nitrogen trifluoride.

3. The method of claim 1, wherein the inert gas is helium.

4. The method of claim 1, wherein the pressure is between 1.5 and 9.5 torr.

5. The method of claim 1, wherein the mixture flow rate is approximately 725 sccm.

6. A method of cleaning a chemical vapor deposition chamber, comprising the steps of;
   a) providing a chemical vapor deposition chamber;
   b) establishing a predetermined temperature in the chemical vapor deposition chamber;
   c) providing a mixture comprising between 15 and 25 percent nitrogen trifluoride in an inert gas at a mixture flow rate of more than 550 standard cubic centimeters per minute (sccm);
   d) establishing a first pressure greater than 1.5 torr in the chemical vapor deposition chamber;
   e) establishing a first plasma in the chemical vapor deposition chamber to chemically activate at least a first portion of the nitrogen trifluoride and to cause removal of an accumulated deposition material from within the chemical vapor deposition chamber;
   f) establishing a second pressure lower than said first pressure in the chemical vapor deposition chamber; and
   g) establishing a second plasma in the chemical vapor deposition chamber to chemically activate at least a second portion of the nitrogen trifluoride and to cause additional removal of the accumulated deposition material from within the chemical vapor deposition chamber.

7. The method of claim 6, wherein the predetermined temperature is the temperature at which the accumulated deposition material was deposited.

8. Method of claim 6, wherein the predetermined temperature is above 200° C.

9. The method of claim 6, wherein the mixture comprising between 15 and 25 percent nitrogen trifluoride in the inert gas comprises about 19 percent nitrogen trifluoride.

10. The method of claim 6, wherein the inert gas is selected from the group consisting of helium, argon, nitrogen, nitrous oxide, and mixtures thereof.

11. The method of claim 6, wherein the first pressure is between 1.5 and 9.5 torr.

12. The method of claim 6, wherein the second pressure is less than 2 torr.

13. The method of claim 6, wherein the chemical vapor deposition chamber includes a susceptor.

14. The method of claim 6, wherein the mixture flow rate is approximately 725 sccm.

15. The method of claim 10, wherein the inert gas is helium.

16. The method of claim 11, wherein the first pressure is between 7 and 9.5 torr.

17. The method of claim 12, wherein the second pressure is about 1.5 torr.

18. A method of operating a chemical vapor deposition chamber comprising the steps of:
   a) providing at least one semiconductor substrate in the chemical vapor deposition chamber;
   b) establishing a predetermined temperature in the chemical vapor deposition chamber;
   c) performing a deposition process by controlling environmental conditions in the chemical vapor deposition chamber so as to effectuate a deposition of at least one predetermined material on a surface of the at least one semiconductor substrate;
   d) terminating the deposition process and removing the at least one semiconductor substrate from the chemical vapor deposition chamber;
   e) substantially maintaining the predetermined temperature in the chemical vapor deposition chamber;
   f) establishing a first pressure in the chemical vapor deposition chamber in a range of about 1.5 to 9.5 torr;
   g) providing a mixture of between 15 and 25 percent nitrogen trifluoride in helium at a mixture flow rate of more than 550 standard cubic centimeters per minute (sccm);
   h) establishing a first plasma within the chemical vapor deposition chamber to chemically activate at least a first portion of the nitrogen trifluoride to cause removal of deposits of the at least one predetermined material from within the chemical vapor deposition chamber;
   i) reducing the first pressure within the chemical vapor deposition chamber to a second pressure of 2 torr or less; and
   j) establishing a second plasma within the chemical vapor deposition chamber to chemically activate at least a second portion of the nitrogen trifluoride to cause additional removal of deposits of the at least one predetermined material from within the chemical vapor deposition chamber.

19. The method of claim 18, wherein the predetermined temperature is above 200° C.

20. The method of claim 18, wherein the mixture of between 15 and 25 percent nitrogen trifluoride in helium comprises about 19 percent nitrogen trifluoride.

21. The method of claim 18, wherein the first pressure is between 7 and 9.5 torr.

22. The method of claim 18, wherein the second pressure is about 1.5 torr.

23. The method of claim 18, wherein the chemical vapor deposition chamber includes a susceptor.

24. The method of claim 18, wherein the mixture flow rate is approximately 725 sccm.

* * * * *